(12) United States Patent
Wong et al.

(10) Patent No.: US 9,648,729 B1
(45) Date of Patent: May 9, 2017

(54) STRESS REDUCTION INTERPOSER FOR CERAMIC NO-LEAD SURFACE MOUNT ELECTRONIC DEVICE

(71) Applicant: Raytheon Company, Waltham, MA (US)

(72) Inventors: Tse E. Wong, Los Alamitos, CA (US); Shea Chen, Plano, TX (US); Hoyoung C. Choe, Torrance, CA (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 14/947,574

(22) Filed: Nov. 20, 2015

(51) Int. Cl.
| H01L 23/52 | (2006.01) |
| H05K 1/02 | (2006.01) |
| H01L 23/492 | (2006.01) |
| H01L 23/498 | (2006.01) |
| H01L 25/065 | (2006.01) |
| H05K 1/11 | (2006.01) |

(52) U.S. Cl.
CPC ....... *H05K 1/0271* (2013.01); *H01L 23/4924* (2013.01); *H01L 23/49811* (2013.01); *H01L 23/49822* (2013.01); *H01L 23/49866* (2013.01); *H01L 25/065* (2013.01); *H05K 1/111* (2013.01)

(58) Field of Classification Search
None
See application file for complete search history.

(56) References Cited

U.S. PATENT DOCUMENTS

| 5,188,985 A | 2/1993 | Medeiros |
| 5,785,799 A | 7/1998 | Culnane |
| D423,532 S | 4/2000 | Yamasaki |
| 6,153,940 A | 11/2000 | Zakel |
| 6,276,593 B1 | 8/2001 | Artaki |
| 6,774,315 B1 | 8/2004 | Pierson |
| 7,208,834 B2 | 4/2007 | Lee |
| 7,245,022 B2 | 7/2007 | Farooq |
| 7,833,897 B2 | 11/2010 | Knickerbocker |
| 7,892,441 B2 | 2/2011 | Pai |
| 7,948,758 B2 | 5/2011 | Buhler |

(Continued)

FOREIGN PATENT DOCUMENTS

| EP | 1041631 A2 | 10/2000 |
| EP | 1677349 A1 | 7/2006 |

OTHER PUBLICATIONS

ISR/WO, Issued Feb. 13, 2017, RAY0324PCT, PCT Application No. PCT/USI6/62700, 12 pages.

*Primary Examiner* — Ermias Woldegeorgis
(74) *Attorney, Agent, or Firm* — Cantor Colburn LLP

(57) ABSTRACT

A stress reduction interposer is provided for disposition between first and second solder materials of first and second electronic devices, respectively. The stress reduction interposer includes a plate element having a central portion and a periphery surrounding the central portion and being formed to define first cavities having an upper area limit at the periphery and a second cavity having a lower area limit, which is higher than the upper area limit, at the central portion and third and fourth solder materials being disposable in the second cavity and in the first cavities, respectively, to be electrically communicative with the first and second solder materials. The third solder material is more compliant and has a higher melting temperature than at least the second and fourth solder materials.

20 Claims, 4 Drawing Sheets

(56) References Cited

U.S. PATENT DOCUMENTS

| | | |
|---|---|---|
| 8,125,081 B2 | 2/2012 | Ohta |
| 2002/0102869 A1 | 8/2002 | Ali et al. |
| 2006/0001179 A1* | 1/2006 | Fukase .................. H01L 23/147 |
| | | 257/778 |
| 2009/0184155 A1 | 7/2009 | Kim |
| 2010/0314072 A1 | 12/2010 | Lee |
| 2011/0239456 A1 | 10/2011 | Conn et al. |

* cited by examiner

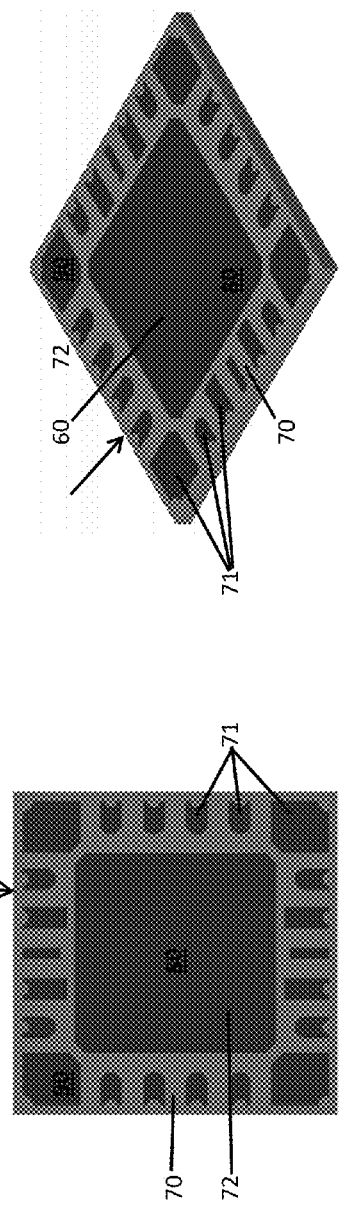
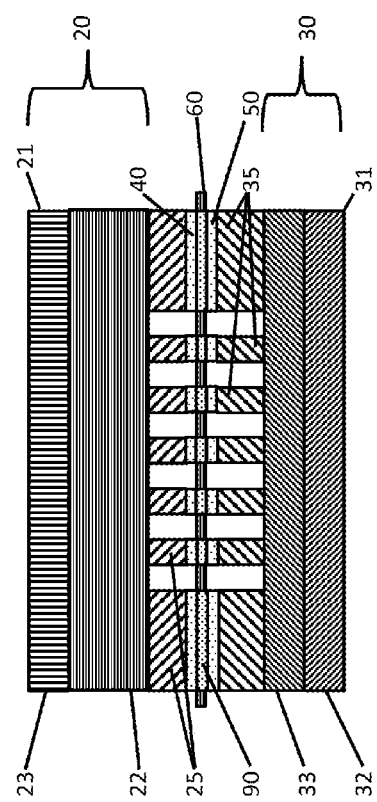

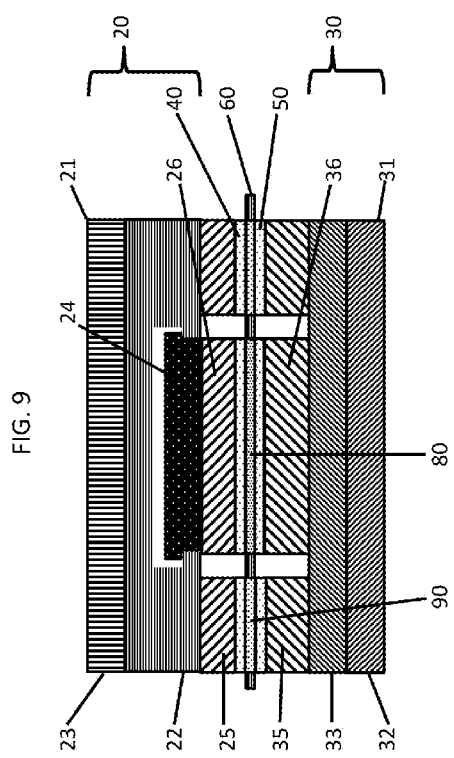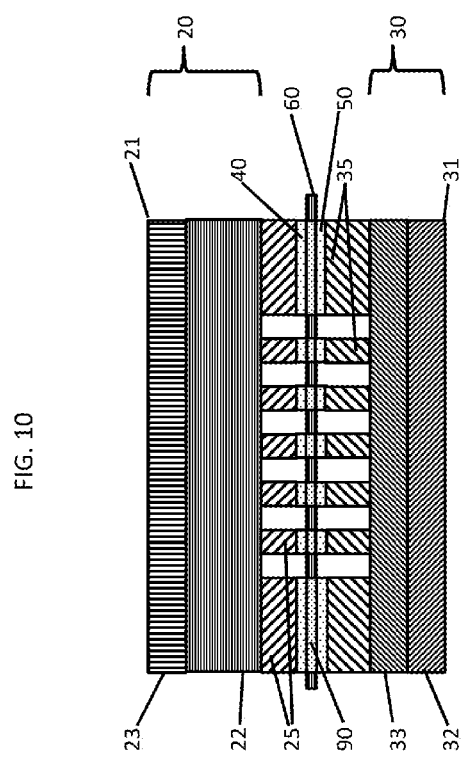

STRESS REDUCTION INTERPOSER FOR CERAMIC NO-LEAD SURFACE MOUNT ELECTRONIC DEVICE

BACKGROUND

The present invention relates to a stress reduction interposer and, more specifically, to a stress reductions interposer for a ceramic quad-flat-pack-no-lead (CQFN) surface mount device (SMD).

An SMD having a CQFN configuration typically includes a frame and lid formed of alumina or another similar material with a Copper Molybdenum (CuMo) heat sink, multiple terminal pads at the CQFN perimeter and one large ground plane in the middle of the CQFN bottom surface. This CQFN configuration is configured to be directly soldered onto a PWB but may have a relatively low solder joint thermal fatigue life due to stresses induced by coefficient of thermal expansion (CTE) mismatches in the CQFN assembly since the CQFN assembly has no compliant leads available to reduce CTE mismatch induced loads.

Previously, leaded ceramic carriers have been designed to have the CQFN soldered onto them and then to be soldered onto the PWB through the compliant leads to reduce the CTE mismatch induced loads. However, a relatively large footprint for this process is necessary. Other strategies have involved the use of compliant interposers for stress relief while still other strategies have employed constrained-core PWBs having a lower CTE or/and a specialized heatsink attached onto the PWB in order to reduce the CTE mismatch induced load. Both of these latter techniques tend to increase the costs and delivery schedules, however, and may not be applicable for larger size CQFN devices anyway.

Still other strategies have relied on the use of packages having extended leads, which would result in a larger foot print, attaching solder balls/columns onto CQFN terminal pads that is then soldered onto the PWB, which presents concerns/risks of solder joint bridging and misalignment due a large ground plane in the middle of the CQFN bottom surface and underfilling the CQFN with selective underfilled materials. In the latter case, underfilled integrity/void presents a risk/concern due to the large ground plane in CQFN. In addition, the reworkability in the underfilled CQFN would be a concern due to the risk of damage to the PWB solder pad or the use of non-reworkable underfilled materials.

SUMMARY

According to one embodiment of the present invention, a stress reduction interposer is provided for disposition between first and second solder materials of first and second electronic devices, respectively. The stress reduction interposer includes a plate element having a central portion and a periphery surrounding the central portion and being formed to define first cavities having an upper area limit at the periphery and a second cavity having a lower area limit, which is higher than the upper area limit, at the central portion and third and fourth solder materials being disposable in the second cavity and in the first cavities, respectively, to be electrically communicative with the first and second solder materials. The third solder material is more compliant and has a higher melting temperature than at least the second and fourth solder materials.

According to another embodiment of the present invention, a stress reduction interposer assembly disposable between first and second electronic devices is provided. The stress reduction interposer includes first and second solder materials disposable proximate to first terminal pads and to a second terminal pad of each of the first and second electronic devices, a plate element formed to define first cavities having an upper area limit at a periphery thereof to respectively correspond to the first terminal pads of each of the first and second electronic devices and a second cavity having a lower area limit, which is higher than the upper area limit, at a central portion thereof to respectively correspond to the second terminal pad of each of the first and second electronic devices and third and fourth solder materials disposable in the second cavity and in the first cavities, respectively, to be electrically communicative with the first and second solder materials. The third solder material is more compliant and has a higher melting temperature than at least the second and fourth solder materials.

According to another embodiment of the present invention, an electronic apparatus is provided and includes a first electronic device comprising first terminal pads and a second terminal pad, a second electronic device comprising first terminal pads and a second terminal pad, first and second solder materials disposable proximate to the first terminal pads and to the second terminal pad of each of the first and second electronic devices, a plate element formed to define first cavities having an upper area limit at a periphery thereof to respectively correspond to the first terminal pads of each of the first and second electronic devices and a second cavity having a lower area limit, which is higher than the upper area limit, at a central portion thereof to respectively correspond to the second terminal pad of each of the first and second electronic devices and third and fourth solder materials disposable in the second cavity and in the first cavities, respectively, to be electrically communicative with the first and second solder materials. The third solder material is more compliant and has a higher melting temperature than at least the second and fourth solder materials.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 6 is a top-down view of a stress reduction interposer of the CQFN SMD assembly of FIGS. 1 and 2 in accordance with embodiments;

FIG. 7 is a perspective view of the stress reduction interposer of FIG. 6;

FIG. 8 is a partial cross-sectional view of a CQFN SMD assembly taken along lines 8-8 of FIG. 1;

FIG. 9 is a partial cross-sectional view of a CQFN SMD assembly taken along lines 9-9 of FIG. 1; and FIG. 10 is a partial cross-sectional view of a CQFN SMD assembly taken along lines 10-10 of FIG. 1.

DETAILED DESCRIPTION

Figure 1:
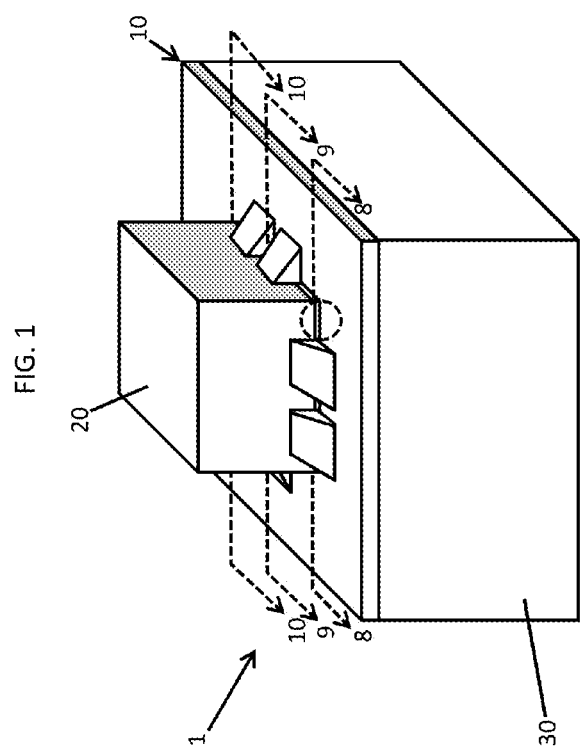
FIG. 1 is a perspective view of a CQFN SMD assembly in accordance with embodiments.
Figure 2:
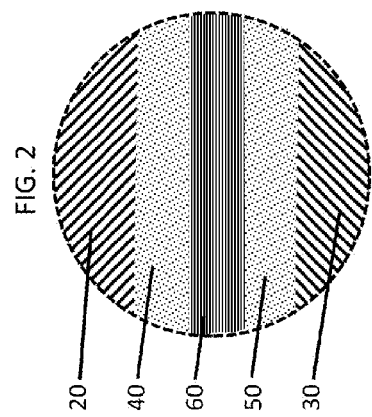
FIG. 2 is an enlarged side view of the encircled portion of the CQFN SMD assembly of FIG. 1.

As will be described below, a stress reduction interposer is sandwiched between the CQFN SMD and the PWB to substantially reduce CTE mismatch induced loads applied in the CQFN solder joint assembly through a thermal fatigue resistant material filled in cavities of the stress reduction interposer and an increase (e.g., doubling) in the overall solder thickness between the CQFN SMD and the PWB to significantly reduce the solder interconnect thermal fatigue damage.

The stress reduction interposer has a stress-reduction mechanism/design, which can be made of various materials and may have a thickness as low as 0.01 inches. The stress reduction interposer has peripheral cavities filled with a thermal fatigue resistant material (e.g., eutectic solder or 63Sn37Pb solder) and a middle/large cavity filled with a solder (e.g., high lead content solder or 90Pb10Sn) that has a much higher melting temperature than 63Sn/37Pb solder. All the cavities of the stress reduction interposer can have predetermined shapes to match with the corresponding terminal soldering pads of the CQFN SMD. In addition, the footprint or real estate of the stress reduction interposer is the same as or slightly larger than the CQFN SMD.

With reference now to FIGS. 1-10, an electronic apparatus 1 is provided and may be configured as a CQFN SMD assembly 10. For purposes of clarity and brevity, the following description will relate to the case in which the electronic apparatus 1 is configured as the CQFN SMD assembly 10 although it is to be understood that this is merely exemplary and not intended to otherwise limit the overall description as a whole. The CQFN SMD assembly 10 includes a first electronic device 20, a second electronic device 30, first solder material 40 proximate to the first electronic device 20, second solder material 50 proximate to the second electronic device 30 and a stress reduction interposer 60.

As shown in FIGS. 8-10, the first electronic device 20 may be provided as a CQFN SMD component 21 and has a frame 22, a lid 23, a heat sink 24, first CQFN terminal pads 25 and a second CQFN terminal pad 26. The lid 23 may be disposed on an exterior or upper surface of the frame 22 and may be formed of alumina or another similar material. The heat sink 24 is disposed within the frame 22 and may be formed of copper molybdenum 65 (CuMo65). The first CQFN terminal pads 25 may be disposed on an interior or lower surface of the frame 22 and may be formed of copper or another similarly electrically conductive material. The second CQFN terminal pad 26 may be disposed on the interior or lower surface of the frame 22 and may be formed of copper or another similarly electrically conductive material.

Figure 3:
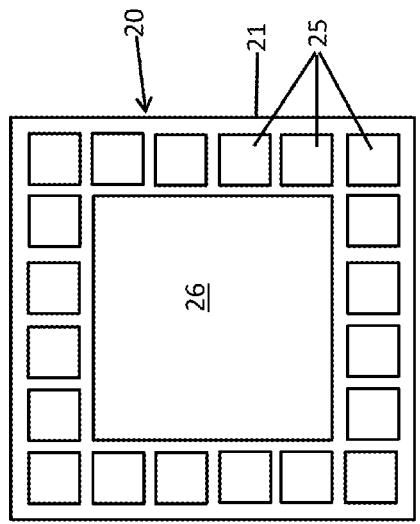
FIG. 3 is a schematic plan view of a CQFN configuration in accordance with embodiments.

In accordance with embodiments, the second CQFN terminal pad 26 may be relatively large in terms of area as compared to the first CQFN terminal pads 25 and may have a lower area or footprint limit that is higher than an upper area or footprint limit of any of the first CQFN terminal pads 25. In accordance with further embodiments and, as shown in FIG. 3, the second CQFN terminal pad 26 may be disposed in a central portion of the frame 22 with the first CQFN terminal pads 25 arrayed about the second CQFN terminal pad 26 in a single-layer polygonal (e.g., rectangular or square) array. In accordance with still further embodiments, the first CQFN terminal pads 25 may have multiple sized areas with some (e.g., corner pads) being the largest and others (e.g., side-long pads) being variably sized and arranged in an interleaved pattern.

Figure 5:
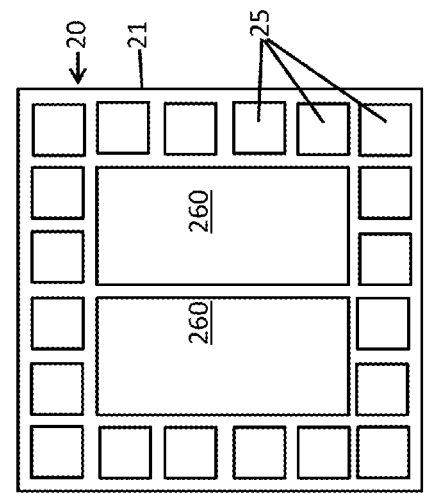
FIG. 5 is a schematic plan view of a CQFN configuration in accordance with alternative embodiments.
Figure 4:
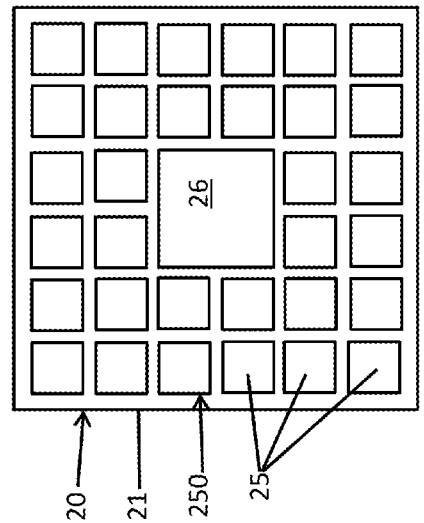
FIG. 4 is a schematic plan view of a CQFN configuration in accordance with alternative embodiments.

In accordance with alternative embodiments and, as shown in FIGS. 4 and 5, the first CQFN terminal pads 25 may be arrayed in a multi-level polygonal array 250 (see FIG. 5) about one or more second CQFN terminal pads 25 and the second CQFN terminal pad 26 may be provided as multiple second CQFN terminal pads 260 (see FIG. 6) within a single- or multi-level polygonal array of the first CQFN terminal pads 25.

The second electronic device 30 may be provided as a PWB 31 and has a PWB substrate 32, a dielectric layer 33 formed on an interior or upper surface of the PWB substrate 32, first PWB terminal pads 35 and a second PWB terminal pad 36. Circuitry may be provided within the PWB substrate 32 and the dielectric layer 33 such that the first and second PWB terminal pads 35 and 36 can be electrically communicative with other/external electronics. The first PWB terminal pads 35 and the second PWB terminal pad 36 may be disposed to extend from an interior or upper surface of the dielectric layer 33 may be formed of copper or another similarly electrically conductive material. In accordance with embodiments, the first PWB terminal pads 35 and the second PWB terminal pad 36 may be provided in arrangements that are similar to those of the first CQFN terminal pads 25 and the second CQFN terminal pad 26 as described above with reference to FIGS. 3-5.

As shown in FIGS. 6 and 7, the stress reduction interposer 60 includes at least one plate element 70 formed to define first cavities 71 and a second cavity 72 and third and fourth solder materials 80 and 90. The first cavities 71 are generally smaller in area than the second cavity 72 and have an upper area or footprint limit that is smaller than the lower area or footprint limit of the second cavity 72. In any case, the first cavities 71 may be defined at a periphery of the plate element 70 to respectively correspond in terms of positions and sizes to the first CQFN terminal pads 25 of the CQFN SMD component 21 and to the first PWB terminal pads 35 of the PWB 31. The second cavity 72 may be defined at a central portion of the plate element 70 to respectively correspond in terms of position and size to the second CQFN terminal pad 26 of the CQFN SMD component 21 and to the second CQFN terminal pad 36 of the PWB 31.

It will be understood from the description provided above that the arrangement and configuration of the first and second cavities 71 and 72 is substantially similar to the arrangement and configuration of the first and second CQFN terminal pads 25 and 26 and of the first and second PWB terminal pads 35 and 36. Thus, it is to be further understood that the arrangement and configuration of the first and second cavities 71 and 72 can be provided to match the embodiments of FIG. 3 or the alternative embodiments of FIGS. 4 and 5. For purposes of clarity and brevity however, the following description will relate to the case where the CQFN SMD component 21 and the PWB 31 have the terminal pad arrangement and configuration of FIG. 3 with first and second cavities 71 and 72 of the plate element 70 being similarly arranged and configured.

The third solder material 80 is disposable in the second cavity 72 and the fourth solder material 90 is disposable in the first cavities 71 such that both the third solder material 80 and the fourth solder material 90 are electrically communicative with the first and second solder materials 40 and 50 and, in turn, with the second CQFN/PWB terminal pads 26/36 and the first CQFN/PWB terminal pads 25/35. The third solder material 80 is more compliant and has a higher melting temperature than at least the second and fourth solder materials 50 and 90.

The first solder materials 40 are disposable proximate to the first and second CQFN terminal pads 25 and 26. The second solder materials 50 are disposable proximate to the first and second PWB terminal pads 35 and 36. In accordance with embodiments, the first and second solder materials 40 and 50 may be formed of similar materials, such as eutectic solder with a Young's modulus of approximately 4.5 msi or, more particularly, 63Sn/37Pb solder. Alternatively, the first and second solder materials 40 and 50 may be formed of different materials, such as where the first solder materials 40 include at least one of eutectic solder or 63Sn/37PB solder and high lead content solder with a Young's modulus of approximately 2.0 msi or, more particularly, 90Pb/10Sn solder and the second solder materials 50 include eutectic solder or 63Sn/37PB solder.

In any case, the characteristic compliance and melting temperature of the first and second solder materials 40 and 50 may be similar to those of 63Sn/37Pb solder. In conventional electronic device assemblies, in which only one of the first and second solder materials would be directly coupled to the CQFN and the PWB terminal pads, induced loads may be generated during thermal cycling and the mismatched CTEs of the CQFN component 21 and the PWB 31. Such induced loads are avoided in the embodiments described herein. That is, with the CQFN component 21 and the PWB 31 configured as described above, the plate element 70 is disposable such that the second cavity 72 and the third solder material 80 are positioned between the first solder material 40 of the second CQFN terminal pad 26 and the second solder material 50 of the second PWB terminal pad 36 (where the first/second solder materials 40/50 would otherwise be used to directly couple the second CQFN/PWB terminal pads 26 and 36) and such that the first cavities 71 and the fourth solder material 90 are positioned between the first solder material 40 of the first CQFN terminal pads 25 and the second solder material 50 of the first PWB terminal pads 35 (where the first/second solder materials 40/50 would otherwise be used to directly couple the first CQFN/PWB terminal pads 25 and 35).

Since the third solder material 80 is more compliant than at least the second and fourth solder materials 50 and 90 and may be more compliant than the first, second and fourth solder materials 40, 50 and 90, the compliance of the third solder material 80 reduces the generation of induced loading of the CQFN SMD assembly 10. In particular, during the thermal cycling associated with the soldering of the first and second solder materials 40 and 50, the CQFN component 21 and the PWB 31 may be exposed to temperatures ranging from about −55° C. or below to about 125° C. or above and thus expand and contract at differing rates and by differing degrees owing to their mismatched CTEs. In such cases, compliance of the third solder material 80 allows the third solder material 80 to absorb thermal expansion and contraction of one of the CQFN component 21 and the PWB 31 relative to the other.

Moreover, since the third solder material 80 has a higher melting temperature than the first, second and fourth solder materials 40, 50 and 90, the third solder material 80 remains in position and form during the solder processes of the first, second and fourth solder materials 40, 50 and 90. In accordance with embodiments, the third solder material 80 may include a high lead content solder with a Young's modulus of approximately 2.0 msi or, more particularly, 90Pb/10Sn solder or some other similar materials. In accordance with alternative embodiments, the first solder material 40 may be similar in composition to the third solder material 80.

The plate element 70 serves multiple functionalities including, but not limited to, preventing reflow of the third and fourth solder materials 80 and 90, permitting heat transfer between the CQFN component 21 and the PWB 31 and preventing short circuits. Each such functionality can be accomplished even while the plate element 70 has a footprint that is similar in size or only slightly larger than the CQFN component 21. That is, in accordance with some embodiments, where the CQFN component 21 has a rectangular shaped footprint and a certain size, the plate element 70 may have a rectangular shaped footprint with substantially the certain size. Conversely, in accordance with alternative embodiments, where the CQFN component 21 has a rectangular shaped footprint and a certain size, the plate element 70 may have an irregularly shaped footprint that largely follows the footprint of the first and second terminal pads 25 and 26.

In accordance with alternative embodiments, the plate element 70 may be provided as multiple plate elements 70. In such cases and for the terminal pad embodiments described above, the multiple plate elements 70 would include a large plate element formed to define the second cavity 72 and small plate elements to define the first cavities 71.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A stress reduction interposer disposable between a first and a second solder materials of a first and a second electronic devices, respectively, and comprising:

a plate element having a central portion and a periphery surrounding the central portion and being formed to define a first cavities having an upper area limit at the periphery and a second cavity having a lower area limit, which is higher than the upper area limit, at the central portion; and a third and a fourth solder materials being disposable in the second cavity and in the first cavities, respectively, to be electrically communicative with the first and the second solder materials, the third solder material being more compliant and having a higher melting temperature than at least the second and fourth solder materials.

2. The stress reduction interposer according to claim 1, wherein the plate element comprises ceramic materials and metallic plating on cavity walls.

3. The stress reduction interposer according to claim 1, wherein the plate element has a footprint of similar or slightly larger size than that of the first electronic device.

4. The stress reduction interposer according to claim 1, wherein the first solder material comprises one of eutectic solder and high lead content solder, the second and fourth solder materials comprise eutectic solder and the third solder material comprises high lead content solder.

5. The stress reduction interposer according to claim 1, wherein the first solder material comprises one of 63Sn/37Pb solder and 90Pb/10Sn solder, the second and fourth solder materials comprise 63 Sn/37Pb solder and the third solder material comprises 90Pb/10Sn solder.

6. A stress reduction interposer assembly disposable between a first and a second electronic devices and comprising:

a first and a second solder materials disposable proximate to a first terminal pads and to a second terminal pad of each of the first and the second electronic devices;

a plate element formed to define a first cavities having an upper area limit at a periphery thereof to respectively correspond to the first terminal pads of each of the first and the second electronic devices and a second cavity having a lower area limit, which is higher than the upper area limit, at a central portion thereof to respectively correspond to the second terminal pad of each of the first and the second electronic devices; and a third and a fourth solder materials disposable in the second cavity and in the first cavities, respectively, to be electrically communicative with the first and the second solder materials, the third solder material being more compliant and having a higher melting temperature than at least the second and the fourth solder materials.

7. The stress reduction interposer assembly according to claim 6, wherein the plate element comprises ceramic materials and metallic plating on cavity walls.

8. The stress reduction interposer assembly according to claim 6, wherein the plate element has a footprint of similar or slightly larger size than that of the first electronic device.

9. The stress reduction interposer assembly according to claim 8, wherein at least the first terminal pads of each of the first and second electronic devices respectively comprise terminal pads of varying sizes.

10. The adaptive interposer according to claim 6, wherein the first solder material comprises one of eutectic solder and high lead content solder, the second and fourth solder materials comprise eutectic solder and the third solder material comprises high lead content solder.

11. The adaptive interposer assembly according to claim 6, wherein the first solder material comprises one of 63Sn/37Pb solder and 90Pb/10Sn solder, the second and fourth solder materials comprise 63Sn/37Pb solder and the third solder material comprises 90Pb/10Sn solder.

12. An electronic apparatus, comprising:

a first electronic device comprising a first terminal pads and a second terminal pad;

a second electronic device comprising the first terminal pads and a second terminal pad;

a first and a second solder materials disposable proximate to the first terminal pads and to the second terminal pad of each of the first and the second electronic devices;

a plate element formed to define a first cavities having an upper area limit at a periphery thereof to respectively correspond to the first terminal pads of each of the first and the second electronic devices and a second cavity having a lower area limit, which is higher than the upper area limit, at a central portion thereof to respectively correspond to the second terminal pad of each of the first and the second electronic devices; and a third and a fourth solder materials disposable in the second cavity and in the first cavities, respectively, to be electrically communicative with the first and the second solder materials, the third solder material being more compliant and having a higher melting temperature than at least the second and the fourth solder materials.

13. The electronic apparatus according to claim 12, wherein the at least one plate element comprises ceramic materials and metallic plating on cavity walls.

14. The electronic apparatus according to claim 12, wherein the first electronic device comprises a surface mount device (SMD) with a quad-flat-pack-no-lead (CQFN) and the second electronic device comprises a printed wiring board (PWB).

15. The electronic apparatus according to claim 14, wherein the plate element has a footprint of similar or slightly larger size than that of the SMD with the CQFN on the PWB.

16. The electronic apparatus according to claim 12, wherein the first terminal pads of each of the first and second electronic devices respectively comprise terminal pads of varying sizes and the first cavities comprise cavities of correspondingly varying sizes.

17. The electronic apparatus according to claim 12, wherein the second terminal pad of each of the first and second electronic devices respectively comprises a single large terminal pad and the second cavity comprises a single correspondingly large cavity.

18. The electronic apparatus according to claim 12, wherein the first cavities are arranged in a multi-layered polygonal array and the second cavity comprises one or more large cavities encompassed within the multi-layered polygonal array.

19. The electronic apparatus according to claim 12, wherein the first solder material comprises one of eutectic solder and high lead content solder, the second and fourth solder materials comprise eutectic solder and the third solder material comprises high lead content solder.

20. The electronic apparatus according to claim 12, wherein the first solder material comprises one of 63Sn/37Pb solder and 90Pb/10Sn solder, the second and fourth solder materials comprise 63Sn/37Pb solder and the third solder material comprises 90Pb/10Sn solder.

* * * * *